US007411843B2

(12) United States Patent
Ruckerbauer et al.

(10) Patent No.: US 7,411,843 B2
(45) Date of Patent: Aug. 12, 2008

(54) SEMICONDUCTOR MEMORY ARRANGEMENT WITH BRANCHED CONTROL AND ADDRESS BUS

(75) Inventors: Hermann Ruckerbauer, Moos (DE); Christian Weiss, München (DE); Ralf Schledz, Zolling (DE); Johannes Stecker, München (DE)

(73) Assignee: Infineon Technologies AG, Neubiberg (DE)

( * ) Notice: Subject to any disclaimer, the term of this patent is extended or adjusted under 35 U.S.C. 154(b) by 253 days.

(21) Appl. No.: 11/226,448

(22) Filed: Sep. 15, 2005

(65) Prior Publication Data

US 2007/0058409 A1  Mar. 15, 2007

(51) Int. Cl.
*G11C 7/00* (2006.01)

(52) U.S. Cl. ............................ 365/191; 365/51; 365/63

(58) Field of Classification Search .................. 365/51, 365/52, 63, 230.01, 233, 191, 198, 233.13
See application file for complete search history.

(56) References Cited

U.S. PATENT DOCUMENTS

| 6,078,965 | A  | * | 6/2000 | Mellitz et al. .................. 710/1 |
| 7,184,360 | B2 | * | 2/2007 | Gregorius et al. ............ 365/233 |
| 7,242,213 | B2 | * | 7/2007 | Pax et al. ....................... 326/30 |
| 7,245,145 | B2 | * | 7/2007 | Pax et al. ....................... 326/30 |
| 2006/0291263 | A1 | * | 12/2006 | Wallner et al. ................. 365/63 |

* cited by examiner

*Primary Examiner*—Richard T. Elms
*Assistant Examiner*—Alexander G Sofocleous
(74) *Attorney, Agent, or Firm*—Edell, Shapiro & Finnan, LLC (57) ABSTRACT

A semiconductor memory arrangement for operation in a data memory system with at least one semiconductor memory chip for the storage of user data includes a memory controller for control of the at least one semiconductor memory chip, and at least one unidirectional signal line bus for control and address signals connected with the memory controller and branching at least once. The at least once branching bus directly connecting at least one semiconductor memory chip with the memory controller and connecting the semiconductor memory chips among each other.

26 Claims, 4 Drawing Sheets

FIG 5

SEMICONDUCTOR MEMORY ARRANGEMENT WITH BRANCHED CONTROL AND ADDRESS BUS

FIELD OF THE INVENTION

The present invention relates to semiconductor memories and, more particularly, to a semiconductor memory arrangement for a data memory system with a plurality of semiconductor memory chips for user data connected to a memory controller by a control and address bus.

BACKGROUND

Considering the continuously increasing processor working speed in computers, such as personal computers, workstations, and servers, it is indispensable to increase the working speed of semiconductor memories in order to prevent losses of performance. Consequently, memory modules with very fast and high density memory components, DDR-DRAMs (Double Data Rate Dynamic Random Access Memory) of generations 1, 2, and 3 have been developed in recent years, in which the working speed and structure density were continually improved.

In a conventional DIMM semiconductor memory module with DDR-DRAMs serving as semiconductor memory chips, for example, two or four ranks per semiconductor memory module are provided, where one rank each is arranged on the front and back side of the semiconductor memory module, or 2 ranks each are arranged on a same side of the semiconductor module in a stack, respectively. According to common definition, in this context "rank" denotes the number of semiconductor memory chips (DRAMs) required to cover the entire bit width of a control and address bus connecting the semiconductor memory units to a memory controller. Therefore, at a bus width of 64 bit or 72 bit including an ECC error correction component (Error Correction Code), a total of 16 (or 18 including ECC) semiconductor memory chips with 4 bit data width or 8 (or 9 including ECC) semiconductor memory chips with 8 bit data width are needed. For example, in registered DIMMs, in which, aside from the memory components, specific buffer components for signal conditioning and decoupling of a bus system provided on the system main board are provided, 4 ranks with memory units of 8 bit width each are realized. More specifically, on one x8-based DIMM with 4 ranks on the front and back side of the wiring plate two ranks each of 8 memory components each are located, which are wired together on several wiring levels by vias and signal line cable runs penetrating through the wiring board.

"Lane" designates a bus of a specific width. In the case of a DDR3 architecture, one speaks of a byte lane which then consists of 8 bits. With x4 based DRAMs, one speaks about a nibble lane. Generally, the term lane combines a group of signals which are identical among each other, which, however, differ as a group from other signals.

In a conventional memory chip topology, for example, in DDR3 DRAMs, the individual memory chips are connected by flyby topology with the memory controller. Here, the control and address signal pins of the individual memory chips are each connected in series to a flyby bus.

A major disadvantage of the flyby topology is the too narrow bandwidth for high data rates of 1.6 Gbit/s/pin, for example, and a too low structural density. An improved semiconductor memory arrangement, which allows large bandwidth and high structure density to be realized even at high data rates of at least 1.6 Gbit/s/pin, is desirable.

SUMMARY

A semiconductor memory arrangement for operation in a data memory system includes at least one semiconductor memory chip for the storage of user data, a memory controller for the control of the semiconductor memory chips, and at least one unidirectional signal line bus for control and address signals. The at least one unidirectional signal line bus for control and address signals branches at least once and directly connects the memory controller with at least one semiconductor memory chip of the semiconductor memory arrangement and connects the semiconductor memory chips among each other. The at least one unidirectional signal line bus for control and address signals may branch to directly connect the memory controller with at least two semiconductor memory chips (for example, by a 1-point-to-2-point connection). In that case, within each branch of the signal line bus for control and address signals, semiconductor memory chips may be connected among each other in a non-branched, serial fashion. Likewise, the at least one unidirectional signal line bus for control and address signals may branch at least once in connecting the semiconductor memory chips among each other. Such branching in connecting the semiconductor chips among each other may, for example, include only a single 1-point-to-2-point connection. Alternatively, the signal line bus for control and address signals may build up a tree-like branching structure.

The signal line bus for control and address signals connecting the semiconductor memory chips is built, for example, from 1-point-to-m-point connections, with m being a natural number in a range from 1 to 4, for example, 2 to 4, so that the branching signal line bus for control and address signals connects, in signal line direction, the memory controller with one or two semiconductor memory chips, and one semiconductor memory chip each with 1 additional semiconductor memory chip or 2 or 3 or 4 additional semiconductor memory chips to, for example, build up a tree-like branching structure. Connecting the semiconductor memory chips among each other, the signal line bus for control and address signals may, for instance, include a single 1-point-to-2-point connection.

Viewed against the signal line direction, i.e., on the signal receiving side, each semiconductor memory chip is connected with one single signal line so that each semiconductor memory chip is connected with one single signal line supplying the control and address signals and a plurality, for example, 1 to 4, of signal lines of the signal line bus re-driving the control and address signals. In order to achieve a high density of semiconductor memory chips (or structure density), a semiconductor memory chip contacts the directly neighboring semiconductor memory chips. The use of 1-point-to-4-point connections between next neighbors of memory chips provides a relatively high structure density. In order to keep short the loss of time during signal transmission between the memory controller and the semiconductor memory chip, the semiconductor memory chips are, for example, wired to each other to provide for re-driving the control and address signals of the memory controller on maximally two semiconductor memory chips connected in series. Furthermore, summing-up of jitter by a frequent re-drive can be avoided.

Further, the semiconductor memory arrangement according to the invention is provided with at least one unidirectional (or alternatively, bi-directional) serial signal line bus for read data. The uni-directional, or alternatively, bi-directional, serial signal line bus for read data serially connects the semiconductor memory chips among each other by 1-pointto-1-point connections and directly connects at least one semiconductor memory chip with the memory controller.

Moreover, at least one semiconductor memory chip includes an evaluation unit for evaluating the control and address signals originating from the memory controller and/or a re-drive unit ("re-drive" functionality) to re-drive, in forward direction, any control and address signals received. An evaluation of the control and address signals by the evaluation unit is, for example, done such that the evaluation unit ascertains whether the received control and address signals are relevant for the semiconductor memory chip belonging to the evaluation unit, i.e., whether the signals are intended for execution by this semiconductor memory chip. In case of a positive evaluation by the evaluation unit, execution of the control and address signals by the corresponding semiconductor memory chip are performed, such as a read or write action, for example, wherein a re-drive of the received control and address signals in forward direction can also take place. For a re-drive of read data, the semiconductor memory chips are each provided with re-drive unit to re-drive the read data in forward direction.

Furthermore, the semiconductor memory array includes, aside from the signal line busses for control and address data and read data, respectively, at least one unidirectional (or bi-directional) serial signal line bus for read data serially connecting the semiconductor memory chips among each other by 1-point-to-1-point connections and directly connecting the memory controller with at least one semiconductor memory chip. The semiconductor memory chips may include a re-drive unit to re-drive, in a forward direction, any write data received from the memory controller.

The signal line bus for control and address signals and/or the signal line bus for write data and/or the signal line bus for read data can each be combined with each other. In the same manner, the signal line busses can each be combined with a clock signal.

According to an exemplary embodiment of the invention, each signal line bus for control and address signals can be allocated to at least one rank, preferably, two ranks. Alternatively, each signal line bus for control and address signals can be allocated to one or more lanes. In any case, control and address signals are distributed within a single lane or among several lanes. Such distribution hinders a combined signal line bus for control and address signals and write data. In such cases, the signal line bus for control and address signals and/or signal line bus for write data each can be allocated to a single lane.

To achieve a relatively large bandwidth with high data rates, a differential line arrangement for the signal line busses employed in the semiconductor memory array according to the invention is provided.

In the semiconductor memory array according to the present invention, the semiconductor memory chips are, for example, DRAM chips, which can, in particular, each feature a DDR interface.

The semiconductor memory array in accordance with the invention can be designed on a system circuit board. Alternatively, the semiconductor memory array can be arranged on a semiconductor memory module, particularly, a DIMM semiconductor memory module that may be suitable and intended to be plugged into a slot on the system circuit board.

When a semiconductor memory arrangement is arranged on a semiconductor memory module, the semiconductor memory arrangement is fit with semiconductor memory chips arranged on a front side and a back side, whereby a signal line bus for control and address signals is connected to the semiconductor memory chips on the front side of the semiconductor memory module and an additional signal line bus (independent of the former) for control and address signals is connected to the semiconductor memory chips on the back side. This allows a latency time of the re-driving of control and address data of the memory controller to be reduced.

The invention further extends to a data memory system with a semiconductor memory arrangement as described above.

BRIEF DESCRIPTION OF THE FIGURES

In the following, the invention is illustrated in more detail with reference to the attached drawings. Identical elements or elements with identical effects are identified by the same reference numbers in the drawings.

DETAILED DESCRIPTION

Figure 1:
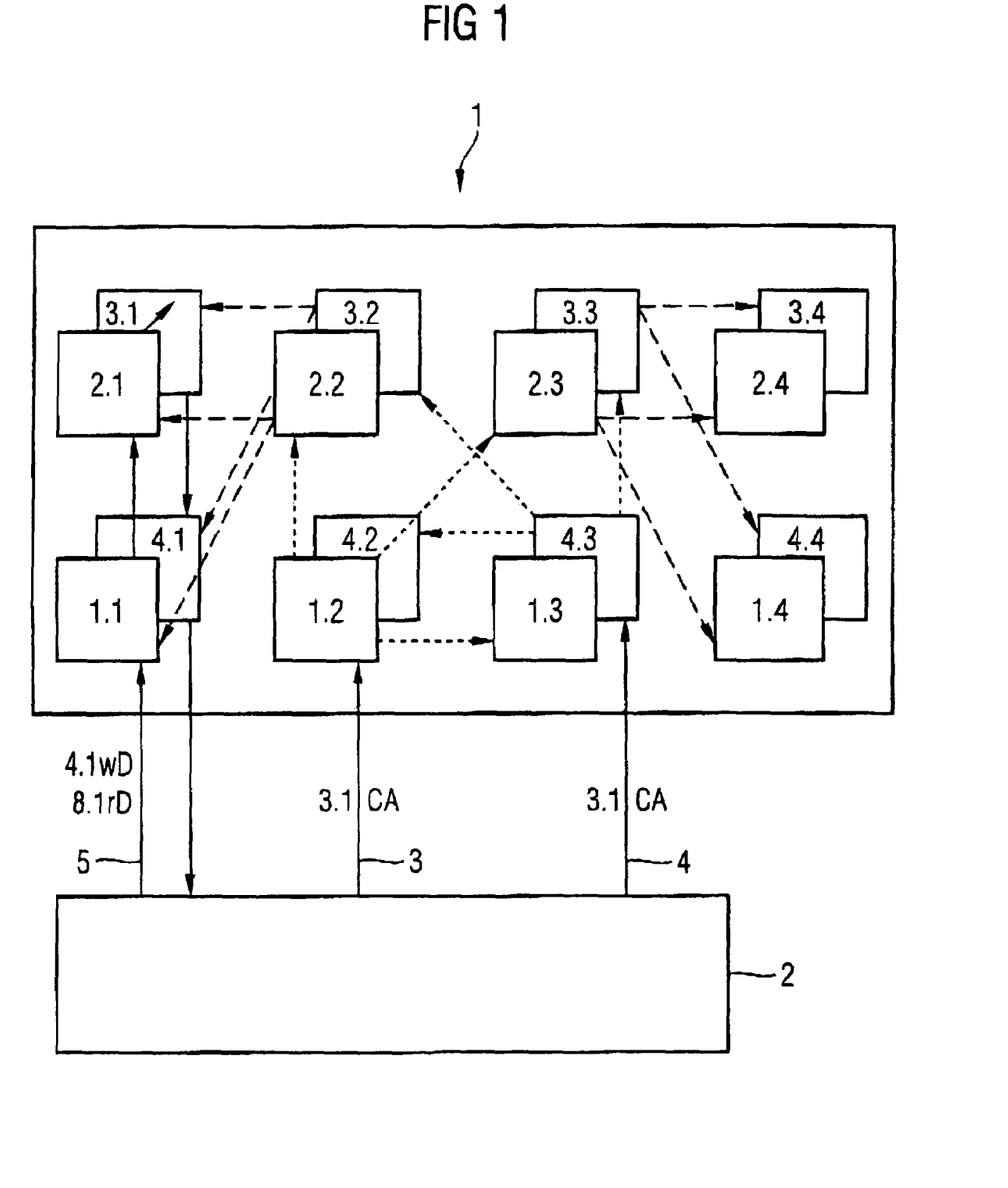
FIG. 1 schematically illustrates the signal line bus topology in one embodiment of the semiconductor memory arrangement according to the invention.

Referring to FIG. 1, the signal line bus topology in an embodiment of the semiconductor memory arrangement according to the invention is shown schematically. Accordingly, on a x4-based DIMM semiconductor memory module, identified by reference number 1, 8 DRAM memory chips 2 are provided on a front side and 8 DRAM memory chips on a back side of the semiconductor memory module. DRAMs 1.1, 1.2, 1.3, 1.4 allocated to a first rank and DRAMs 2.1, 2.2, 2.3, 2.4 allocated to a second rank are arranged on the front side of the DIMM module 1. DRAMs 3.1, 3.2, 3.3, 3.4 allocated to a third rank and DRAMs 4.1, 4.2, 4.3, 4.4 allocated to a fourth rank are arranged on the back side of the DIMM module 1.

The DIMM module 1 is connected to a memory controller 2 by a first uni-directional signal line bus 3 for control and address signals, a second uni-directional signal line bus 4 for control and address signals, and four unidirectional combined signal line busses 5 for write and read data (only one of which is shown in FIG. 1 for the sake of clarity).

The first uni-directional signal line bus 3 for control and address signals is connected only to DRAMs on the front side of the DIMM module 1, whereas the second uni-directional signal line bus 4 for control and address signals is connected only to DRAMs on the back side of the DIMM module 1. In more detail, the first signal line bus 3 for control and address signals connects the memory controller 2 first to DRAM 1.2 by a 1-point-to-1-point connection. DRAM 1.2 is connected to the adjacent DRAMs, 1.3, 2.2, 2.3 by a 1-point-to-3-point connection. DRAM 2.2 is connected to DRAMs 2.1 and 1.1. DRAM 2.3 is connected to DRAMs 2.4 and 1.4. Otherwise, the second signal line bus 4 for control and address signals connects the memory controller 2 first to DRAM 4.3 by a 1-point-to-1-point connection. DRAM 4.3 is connected to the adjacent DRAMs, 3.3, 3.2, 4.2 by a 1-point-to-3-point connection. DRAM 3.3 is connected to DRAMs 3.4 and 4.4 by a 1-point-to-2-point connection. DRAM 3.2 is connected to DRAMs 3.1 and 4.1 by a 1-point-to-2-point connection. Consequently, the control and address signals of the memory controller 2 are switched at most twice in the two signal line busses 3, 4 for control and address signals such that the signal run times are relatively short. Accordingly, the DRAMs are provided with control and address data within a relatively short time span.

The two signal line busses 3, 4 for control and address signals possess a branching, tree-like structure within the DRAMs. Further, the two signal line busses 3, 4 for control and address signals are, for example, 4 bit-wide signal line busses in combination with a clock signal (3.1 CA). A differential signal line couple is allocated to each individual bit.

Moreover, the non-terminal DRAMs of a serial connection have a re-drive unit for re-driving the control and address signals of the memory controller, which effect re-drive of any control and address signals to the DRAM(s) connected to them provided that the corresponding DRAM is not the addressee. However, re-drive of control and address signals can also be effected in case the corresponding DRAM is the addressee. For instance, re-drive of control and address signals of the memory controller from DRAM 1.2 to DRAMs 1.3, 2.3, 2.2 is effected in case DRAM 1.2 is not the addressee of the control and address signals of the memory controller. The same applies for DRAMs 1.3, 2.3, 2.2. Insofar, one signal line bus for control and address signals is allocated to two ranks. Accordingly, in the configuration of FIG. 1, each signal line bus for control and address signals provides for two ranks.

The combined signal line busses for write and read data are for connection of the memory controller 2 with the DRAMs of a lane. The combined signal line bus 5 for write and read data shown connects the memory controller 2 to DRAM 1.1, DRAM 1.2, DRAM 3.1, and DRAM 4.1, whereby a signal line returns from DRAM 4.1 back to the memory controller 2. The combined signal line bus 5 for write and read data includes a 5 bit-wide data line for 4-bit write data, to which a separate clock signal is allocated (4.1 wD), as well as a 9 bit-wide data line for 8-bit read data, to which a separate clock signal is allocated also (8.1 rD). The combined signal line bus 5 for write and read data is implemented, for example, as differential line couples per bit. Not shown in FIG. 1 in any detail are additional combined signal line busses for write and read data for connecting the memory controller 2 to DRAMs of other lanes, namely a combined signal line bus for connecting the memory controller 2 to the DRAMs, 1.2, 2.2, 3.2, 4.2, and for connecting DRAM 4.2 to the memory controller (single lane), a combined signal line bus for connecting the memory controller 2 to the DRAMs, 1.3, 2.3, 3.3, 4.3, and for connecting DRAM 4.3 to the memory controller 8 (single lane), and a combined signal line bus for connecting the memory controller 2 to the DRAMs, 1.4, 2.4, 3.4, 4.4, and for connecting DRAM 4.4 to the memory controller.

Figure 2:
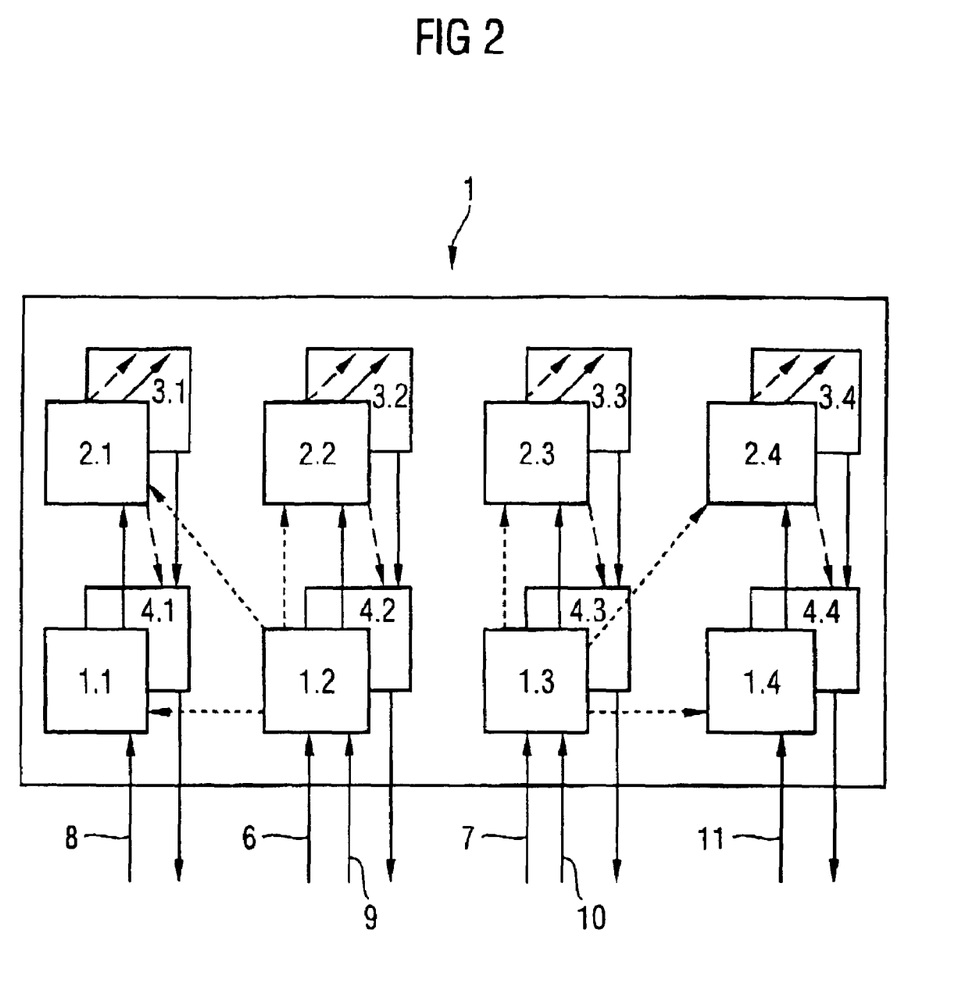
FIG. 2 schematically illustrates the signal line bus topology in another embodiment of the semiconductor memory arrangement according to the invention.

Referring to FIG. 2, the signal line bus topology in another embodiment of the semiconductor memory arrangement according to the present invention is shown schematically. In order to avoid unnecessary repetition, only the differences as compared to the semiconductor memory arrangement of FIG. 1 are illustrated and described.

Accordingly, the DRAMs in a first DIMM module 1 are connected to a memory controller 2 by a first uni-directional signal line bus 6 for control and address signals, a second uni-directional signal line bus 7 for control and address signals, and four uni-directional combined signal line busses 8, 9, 10, 11 for write and read data. In contrast to the embodiment of FIG. 1, in the embodiment of FIG. 2, the two signal line busses 6, 7 are connected to DRAMs on the front side and on the back side of the DIMM module 1. In more detail, the first signal line bus 6 for control and address signals connects the memory controller 2 first to DRAM 1.2 by a 1-point-to-1-point connection. DRAM 1.2 is connected to the adjacent DRAMs, 1.1, 2.1, 2.2 by a 1-point-to-3-point connection. DRAM 2.1 is connected to DRAMs 3.1 and 4.1 on the back side of the DIMM module 1 by a 1-point-to-2-point connection. DRAM 2.2 is connected to DRAMs 3.2 and 4.2 on the back side of the DIMM module 1 by a 1-point-to-2-point connection. Otherwise, the second signal line bus 7 for control and address signals connects the memory controller 2 first to DRAM 1.3 by a 1-point-to-1-point connection. DRAM 1.3 is connected to the adjacent DRAMs, 1.4, 2.3, 2.4 by a 1-point-to-3-point connection. DRAM 2.3 is connected to DRAMs 3.3 and 4.3 on the back side of the DIMM module 1 by a 1-point-to-2-point connection. DRAM 2.4 is connected to DRAMs 3.4 and 4.4 on the back side of the DIMM module 1 by a 1-point-to-2-point connection. Consequently, the control and address signals of the memory controller (not shown in any detail in FIG. 2) are switched maximally twice until they reach their addressee. Accordingly, in the configuration of FIG. 2, in contrast to FIG. 1, each rank is distributed to both signal line busses for control and address signals.

Moreover, combined signal line busses 8, 9, 10, and 11 for write and read data for connecting the memory controller 2 to DRAMs of a corresponding lane are shown in the embodiment of FIG. 2. The first combined signal line bus 8 for write and read data herein connects the memory controller 2 to DRAMs 1.1, 1.2, 3.1, 4.1, whereby a signal line returns from DRAM 4.1 to the memory controller 2. Moreover, the second combined signal line bus 9 for write and read data herein connects the memory controller 2 to DRAMs 1.2, 2.2, 3.2, 4.2, whereby a signal line returns from DRAM 4.2 to the memory controller 2. Moreover, the third combined signal line bus 10 for write and read data herein connects the memory controller 2 to DRAMs 1.3, 2.3, 3.3, 4.3, whereby a signal line returns from DRAM 4.3 to the memory controller 2. Moreover, the fourth combined signal line bus 11 for write and read data herein connects the memory controller 2 to DRAMs 1.4, 2.4, 3.4, 4.4, whereby a signal line returns from DRAM 4.4 to the memory controller 2.

Figure 3:
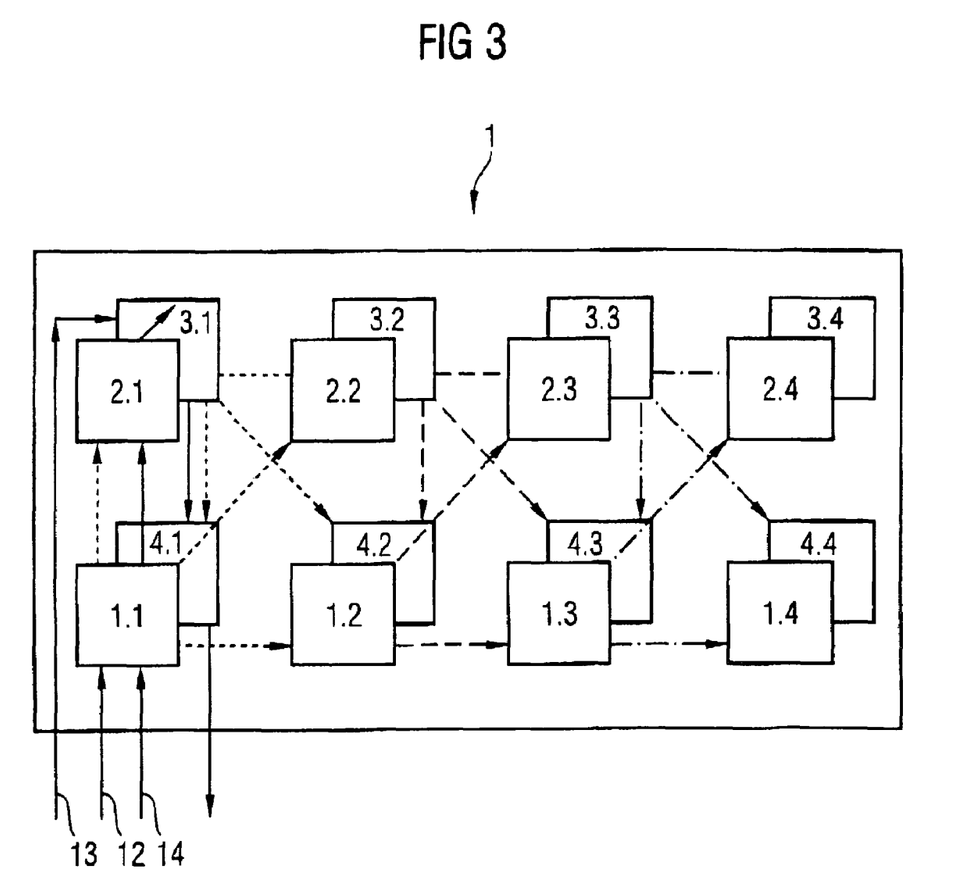
FIG. 3 schematically illustrates the signal line bus topology in another embodiment of the semiconductor memory arrangement according to the invention.

Referring to FIG. 3, the signal line bus topology in another embodiment of the semiconductor memory arrangement according to the invention is shown schematically. In order to avoid unnecessary repetition, only the differences as compared to the semiconductor memory arrangement of FIG. 1 are illustrated and described.

Accordingly, the DRAMs in a first DIMM module 1 are connected to a memory controller 2 by a first uni-directional signal line bus 12 for control and address signals, a second uni-directional signal line bus 13 for control and address signals, and four uni-directional combined signal line busses for write and read data of which only one is shown in FIG. 3 (reference number 14). Like in the embodiment of FIG. 1, in the embodiment of FIG. 3, the two signal line busses 6, 7 each are connected only to DRAMs on the front side or on the back side of the DIMM module 1. In more detail, the first signal line bus 12 for control and address signals connects the memory controller 2 first to DRAM 1.1 by a 1-point-to-1-point connection. DRAM 1.1 is connected to the adjacent DRAMs, 1.2, 2.1, 2.2 by a 1-point-to-3-point connection. DRAM 1.2 is connected to DRAMs 1.3 and 2.3 by a 1-point-to-2-point connection. DRAM 1.3 is connected, in addition, to DRAMs 1.4 and 2.4 by a 1-point-to-2-point connection. Otherwise, the second signal line bus 13 for control and address signals connects the memory controller 2 first to DRAM 3.1 on the back side of the DIMM module 1 by a 1-point-to-1-point connection. DRAM 3.1 is connected to the adjacent DRAMs, 3.2, 4.1, 4.2 by a 1-point-to-3-point connection. DRAM 3.2 is connected to DRAMs 3.3 and 4.3 by a 1-point-to-2-point connection. DRAM 3.3 is connected to DRAMs 3.4 and 4.4 by a 1-point-to-2-point connection. Consequently, the control and address signals of the memory controller (not shown in any detail in FIG. 2) are switched maximally three times until the signals reach their addressee.

Moreover, combined signal line busses for write and read data for connecting the memory controller 2 to DRAMs of a corresponding lane are shown in the embodiment of FIG. 2. The first combined signal line bus 14 for write and read data herein connects the memory controller 2 to DRAMs 1.1, 1.2, 3.1, 4.1, whereby a signal line returns from DRAM 4.1 to the memory controller 2. The second combined signal line bus 9 for write and read data (not shown in any detail in FIG. 3) herein connects the memory controller 2 to DRAMs 1.2, 2.2, 3.2, 4.2, whereby a signal line returns from DRAM 4.2 to the memory controller 2. The third combined signal line bus 10 for write and read data (not shown in any detail in FIG. 3) herein connects the memory controller 2 to DRAMs 1.3, 2.3, 3.3, 4.3, whereby a signal line returns from DRAM 4.3 to the memory controller 2. The fourth combined signal line bus 11 for write and read data (not shown in any detail in FIG. 3) herein connects the memory controller 2 to DRAMs 1.4, 2.4, 3.4, 4.4, whereby a signal line returns from DRAM 4.4 to the memory controller 2. The DIMM has only 1-point-to-2-point connections, so that higher signal velocities can be obtained. However, signals have to be re-driven three times, resulting in higher latency.

Figure 4:
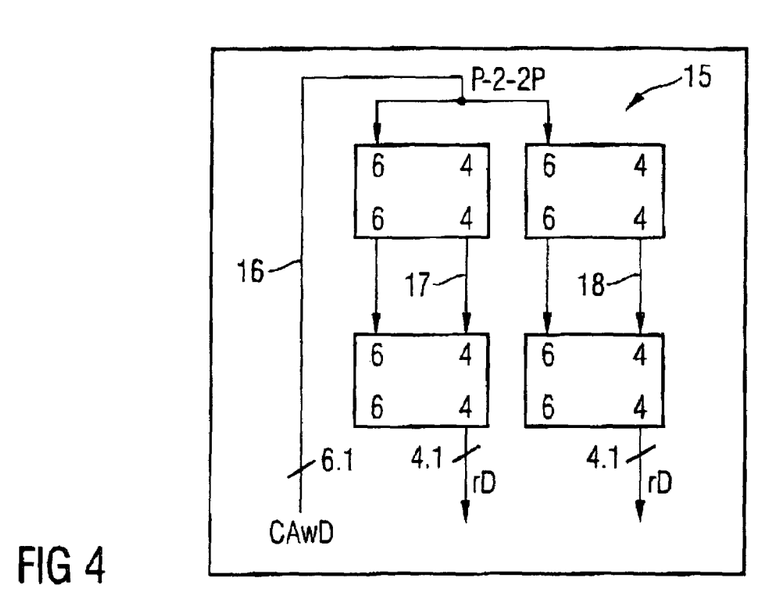
FIG. 4 schematically illustrates the signal line bus topology in another embodiment of the semiconductor memory arrangement according to the invention.

Referring to FIG. 4, contrary to the tree-like branching structures of signal line busses of control and address signals of FIGS. 1, 2, and 3, signal line bus topology of an embodiment of the semiconductor memory arrangement of the present invention is schematically shown. The memory controller is directly connected to two semiconductor memory chips by a branching connection (1-point-to-2-point-connection).

In FIG. 4, a single lane (referenced by reference sign 15) of a x8 based DIMM semiconductor memory module having 4 relatively identical lanes in total is shown. Accordingly, 4 DRAM memory chips are shown per lane. However, 1, 2, 4, 6 or 8 DRAMs per lane may be provided. Each lane 15 of the DIMM module is connected to a (not shown) memory controller by a unidirectional signal line bus 16 for control and address signals which is combined with a unidirectional signal line bus for write data and two parallel signal line busses for read data 17, 18.

The combined signal line bus 16 for control and address signals and write data is provided with a branching to directly connect the memory controller to two DRAMs of a same rank. Further DRAMs of that lane 15 of the DIMM module are serially connected with those DRAMs directly connected to the memory controller by 1-point-to-1-point connections. Each of the two parallel signal line busses for read data 17, 18 serially connects two DRAMs with each other to process the read data.

The combined signal line bus 16 for control and address signals and write data is provided as a clock signal combined data bus having a bit width of 7 bits, 6 bits of which are used for data signals. Each of both signal line busses 17, 18 for read data is a 4 bits wide bus, which is combined with a clock signal.

Figure 5:
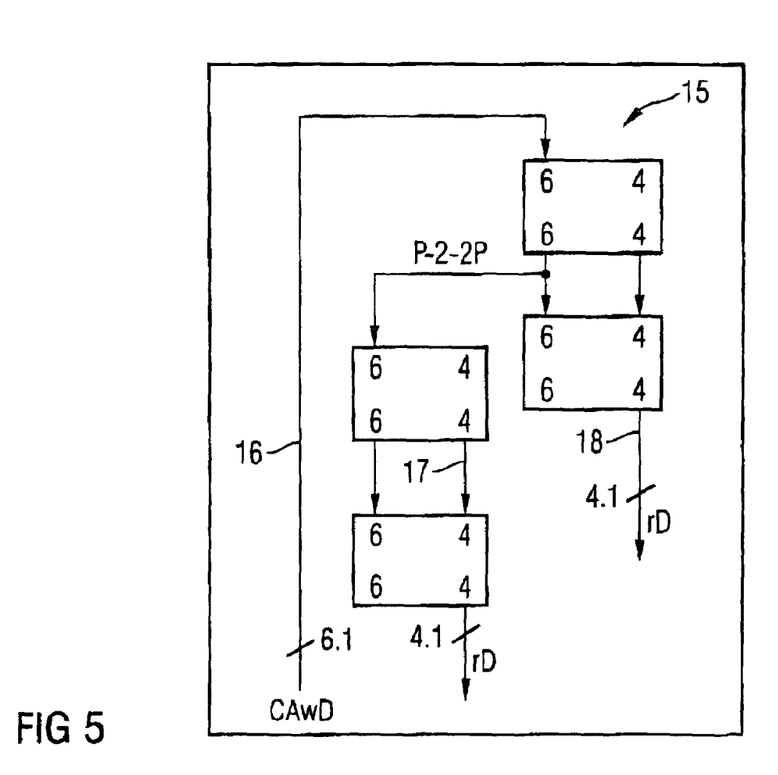
FIG. 5 schematically illustrates the signal line bus topology in another embodiment of the semiconductor memory arrangement according to the invention.

Referring to FIG. 5, signal line bus topology according to another embodiment of the semiconductor memory arrangement according to the invention by a single lane is schematically illustrated. In FIG. 5, a single lane (referenced by reference sign 15) of a x4 based DIMM semiconductor memory module having 4 relatively identical lanes in total, is shown, whereby reference is made to a read data bus width. Accordingly, 4 DRAM memory chips are provided per lane. Each lane 15 of the DIMM module is connected to a memory controller (not shown) by a unidirectional signal line bus for control and address signals 16 that is combined with a unidirectional signal line bus for write data and two parallel signal line busses 17, 18 for read data. Contrary to the signal line bus topology shown in FIG. 4, the combined signal line bus 16 for control and address signals and write data of the arrangement of FIG. 5 directly connects the memory controller to a single DRAM, wherein the combined signal line bus 16 for control and address signals and write data branches after that DRAM by a 1-point-to-2-point connection and contacts two further DRAMs of that lane. The remaining DRAM of the lane is serially connected to one of the already contacted DRAMs by a 1-point-to-1-point connection.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

LIST OF REFERENCE NUMBERS

1 DIMM module
2 Memory controller
3 Signal line bus for control and address signals
4 Signal line bus for control and address signals
5 Signal line bus for write and read data
6 Signal line bus for control and address signals
7 Signal line bus for control and address signals
8 Signal line bus for write and read data
9 Signal line bus for write and read data
10 Signal line bus for write and read data
11 Signal line bus for write and read data
12 Signal line bus for control and address signals
13 Signal line bus for control and address signals
14 Signal line bus for write and read data
15 Lane
16 Signal line bus for control and address signals and write data
17 Signal line bus for read data
18 Signal line bus for for read data

What is claimed:

1. A semiconductor memory arrangement for operation in a data memory system comprising:
   at least one semiconductor memory chip for the storage of user data;
   a memory controller for control of the at least one semiconductor memory chip; and
   at least one unidirectional signal line bus for control and address signals connected with the memory controller and branching at least once, the at least once branching bus directly connecting at least one semiconductor memory chip with the memory controller and connecting the semiconductor memory chips among each other.

2. The semiconductor memory arrangement according to claim 1, wherein the signal line bus for control and address signals includes 1-point-to-m-point connections, whereby m is a natural number in the range of 1 to 4.

3. The semiconductor memory arrangement according to claim 1, wherein the at least one signal line bus for control and address signals branches to directly connect the memory controller to at least two semiconductor memory chips.

4. The semiconductor memory arrangement according to claim 3, wherein the at least one signal line bus for control and address signals serially connects the semiconductor memory chips of each branch with each other in a non-branched fashion.

5. The semiconductor memory arrangement according to claim 1, wherein the at least one signal line bus for control and address signals connects the semiconductor memory chips with each other by a tree-like branching structure.

6. The semiconductor memory arrangement according to claim 1, further comprising:
at least one signal line bus for read data, wherein the signal line bus for read data directly connects one of the semiconductor memory chips to the memory controller and serially connects the semiconductor memory chips with each other by 1-point-to-1-point connections.

7. The semiconductor memory arrangement according to claim 1, wherein at least one of the semiconductor memory chips is provided with a re-drive unit for re-driving of control and address signals.

8. The semiconductor memory arrangement according to claim 1, wherein at least one of the semiconductor memory chips includes an evaluation unit for evaluating control and address signals.

9. The semiconductor memory arrangement according to claim 1, wherein at least one of the semiconductor memory chips includes a re-drive unit for re-driving of read signals.

10. The semiconductor memory arrangement according to claim 1, further comprising:
at least one signal line bus for write data, wherein the signal line bus for write data directly connects one of the semiconductor memory chips to the memory controller and serially connects the semiconductor memory chips with each other by 1-point-to-1-point connections.

11. The semiconductor memory arrangement according to claim 10, wherein at least one of the semiconductor memory chips includes a re-drive unit for re-driving of write signals.

12. The semiconductor memory arrangement according to claim 1, wherein a signal line bus for control and address signals is allocated to at least one rank.

13. The semiconductor memory arrangement according to claim 12, wherein a signal line bus for control and address signals is allocated to two or four ranks.

14. The semiconductor memory arrangement according to claim 1, wherein a signal line bus for control and address signals is allocated to at least one lane.

15. The semiconductor memory arrangement according to claim 14, wherein a signal line bus for control and address signals is allocated to more than one lane.

16. The semiconductor memory arrangement according to claim 1, wherein a signal line bus for read data is allocated to one lane.

17. The semiconductor memory arrangement according to claim 1, wherein a signal line bus for write data is allocated to one lane.

18. The semiconductor memory arrangement according to claim 1, wherein at least one signal line bus selected from the group consisting of a signal line bus for control and address signals, a signal line bus for write signals and a signal line bus for read signals, is comprised of differential signal line pairs.

19. The semiconductor memory arrangement according to claim 1, wherein at least one signal line bus selected from the group consisting of a signal line bus for control and address signals, a signal line bus for write signals and a signal line bus for read signals, is combined with a signal line bus for clock signals.

20. The semiconductor memory arrangement according to claim 1, wherein at least two signal line bus selected from the group consisting of a signal line bus for control and address signals, a signal line bus for write signals and a signal line bus for read signals, are combined with each other.

21. The semiconductor memory arrangement according to claim 1, wherein the semiconductor memory chips are provided in the form of DRAM semiconductor memory chips.

22. The semiconductor memory arrangement according to claim 21, wherein the semiconductor memory chips each include a DDR interface.

23. The semiconductor memory arrangement according to claim 1, wherein the semiconductor memory arrangement is arranged on a semiconductor memory module.

24. The semiconductor memory arrangement according to claim 1, wherein the semiconductor memory module is DIMM semiconductor memory module.

25. The semiconductor memory arrangement according to claim 23, further comprising:
a semiconductor memory module with semiconductor memory chips arranged on a front and a back side;
one signal line bus for control and address data connected to the semiconductor memory chips on the front side of the semiconductor memory module; and
an additional signal line bus for control and address data connected to the semiconductor memory chips on the back side of the semiconductor memory module.

26. A data memory system, comprising:
a plurality of semiconductor memory arrangements, individual ones of the semiconductor memory arrangements comprising:
at least one semiconductor memory chip for the storage of user data;
a memory controller for control of the at least one semiconductor memory chip; and
at least one unidirectional signal line bus for control and address signals connected with the memory controller and branching at least once, the at least once branching bus directly connecting at least one semiconductor memory chip with the memory controller and connecting the semiconductor memory chips among each other.

* * * * *

UNITED STATES PATENT AND TRADEMARK OFFICE
CERTIFICATE OF CORRECTION

| | | |
|---|---|---|
| PATENT NO. | : 7,411,843 B2 | Page 1 of 1 |
| APPLICATION NO. | : 11/226448 | |
| DATED | : August 12, 2008 | |
| INVENTOR(S) | : Hermann Ruckerbauer | |

It is certified that error appears in the above-identified patent and that said Letters Patent is hereby corrected as shown below:

Column 8, line 66, cancel the text beginning with "1-point-to-in-point" and insert --1-point-to-m-point--

Signed and Sealed this

Twenty-first Day of October, 2008

JON W. DUDAS
*Director of the United States Patent and Trademark Office*